(12) United States Patent  
Sato et al.

(10) Patent No.: US 9,809,879 B2  
(45) Date of Patent: Nov. 7, 2017

(54) LAMINATE, GAS BARRIER FILM, AND MANUFACTURING METHOD THEREFOR

(71) Applicant: Toppan Printing Co., Ltd., Taito-ku, Tokyo (JP)

(72) Inventors: Jin Sato, Tokyo (JP); Mitsuru Kano, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 138 days.

(21) Appl. No.: 14/687,515

(22) Filed: Apr. 15, 2015

(65) Prior Publication Data

US 2015/0292086 A1    Oct. 15, 2015

Related U.S. Application Data

(63) Continuation of application No. PCT/JP2013/078270, filed on Oct. 18, 2013.

(30) Foreign Application Priority Data

Oct. 18, 2012 (JP) ................................ 2012-230658

(51) Int. Cl.
  *B05D 3/14* (2006.01)
  *C08L 101/02* (2006.01)
  (Continued)

(52) U.S. Cl.
  CPC ......... *C23C 16/45525* (2013.01); *C08J 7/045* (2013.01); *C23C 16/02* (2013.01);
  (Continued)

(58) Field of Classification Search
  CPC ............................ C23C 16/45525–16/45555
  See application file for complete search history.

(56) References Cited

U.S. PATENT DOCUMENTS

2004/0194691 A1*  10/2004  George ................. B01J 31/069
                                                                  117/84
2009/0072230 A1    3/2009  Ito et al.
         (Continued)

FOREIGN PATENT DOCUMENTS

CN         102007173 A       4/2011
CN         103732392 A       4/2014
         (Continued)

OTHER PUBLICATIONS

First Office Action for Chinese Patent Application No. 201380053425.2 dated Apr. 12, 2016.
         (Continued)

*Primary Examiner* — Ramsey Zacharia
(74) *Attorney, Agent, or Firm* — Michael D. Kaminski; Foley & Lardner LLP

(57) ABSTRACT

A laminate (1) provided with: a substrate (2); an undercoat layer (3), which is formed on at least a portion of the outer surface of the substrate (2), contains an organic polymer with a functional group, and is formed in a membrane form or film form; and an atomic layer deposition film (4), which contains a precursor (6) that serves as a starting material, is formed so as to cover the surface of the undercoat layer (3), and in which at least some of the precursor (6) are bonded to the functional groups. The linear expansion coefficient of a layered film provided with the substrate (2) and the undercoat layer (3) is from about $1.0 \times 10^{-5}$/K to about $8.0 \times 10^{-5}$/K.

11 Claims, 9 Drawing Sheets

(51) Int. Cl.

| | | |
|---|---|---|
| *C08L 101/06* | (2006.01) | |
| *C08L 101/08* | (2006.01) | |
| *C23C 16/455* | (2006.01) | |
| *C23C 16/02* | (2006.01) | |
| *C23C 16/50* | (2006.01) | |
| *C08J 7/04* | (2006.01) | |

(52) U.S. Cl.
CPC .............. *C23C 16/50* (2013.01); *B05D 3/144* (2013.01); *C08J 2367/02* (2013.01); *C08J 2400/10* (2013.01); *C08J 2400/104* (2013.01); *C08J 2400/106* (2013.01); *C08L 2201/14* (2013.01); *C23C 16/45529* (2013.01)

(56) References Cited

U.S. PATENT DOCUMENTS

| | | |
|---|---|---|
| 2011/0100454 A1 | 5/2011 | Adam et al. |
| 2014/0141255 A1 | 5/2014 | Kano et al. |

FOREIGN PATENT DOCUMENTS

| | | |
|---|---|---|
| EP | 2 737 996 A1 | 6/2014 |
| JP | 2003-327718 A | 11/2003 |
| JP | 2007-90803 | 4/2007 |
| JP | 2007-516347 A | 6/2007 |
| JP | 2011-518055 | 6/2011 |
| JP | 2011-173261 | 9/2011 |
| JP | 2012-96131 | 5/2012 |
| WO | WO-2009/127842 A1 | 10/2009 |
| WO | WO2013-015412 | 1/2013 |

OTHER PUBLICATIONS

International Search Report dated Jan. 21, 2014 regarding Application No. PCT/JP2013/078270.
Extended European Search Report issued in Application No. 13846444.1 dated Apr. 29, 2016.
Second Office Action issued in Chinese Patent Application No. 2013800534252 dated Nov. 1, 2016.

\* cited by examiner

Methyl Group

Hydroxyl Group

Amide Group

Urethane Resin

Isocyanate Group

Polyimide Resin

Imide Group

PES

Sulfone Group

PET

Ester Group
(Not Readily Adsorbed Unless Plasma Treatment Is Performed)

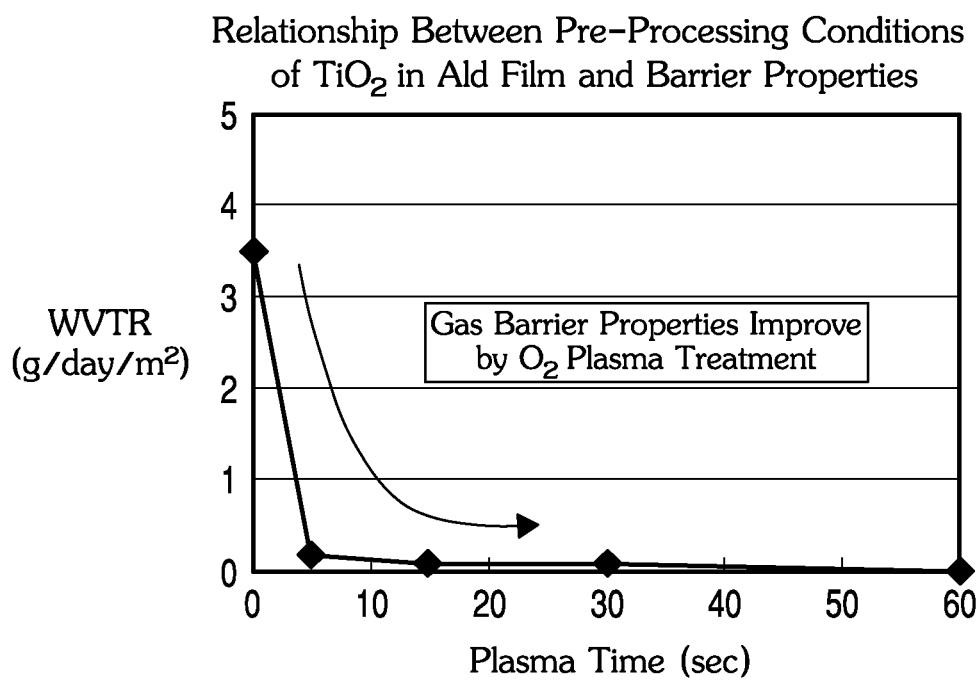

FIG. 12

| | Base Material | Plasma Treatment | Undercoat Layer | Ald Film | Layered Film Linear Expansion Coefficient ($\times 10^{-5}$/K) | Initial WVTR (g/m²/day) | WVTR After Durability Test (g/m²/day) |
|---|---|---|---|---|---|---|---|
| Example 1 | PET 100μm | Treated | PVA Layer | $TiO_2$ | 6.5 | <$5.0 \times 10^{-4}$ | $5.1 \times 10^{-3}$ |
| Example 2 | PET 100μm | Treated | PI Layer | $TiO_2$ | 3.0 | <$5.0 \times 10^{-4}$ | <$5.0 \times 10^{-4}$ |
| Example 3 | PET 100μm | Treated | PES Layer | $TiO_2$ | 5.5 | <$5.0 \times 10^{-4}$ | $1.5 \times 10^{-3}$ |
| Example 4 | PET 100μm | Treated | None | $TiO_2$ | 1.1 | $7.4 \times 10^{-4}$ | $8.1 \times 10^{-4}$ |
| Example 5 | PET 100μm | Treated | None | $TiO_2$ | 4.0 | $9.8 \times 10^{-4}$ | $1.2 \times 10^{-3}$ |
| Comparative Example 1 | PET 100μm | Untreated | None | $TiO_2$ | 4.0 | $4.3 \times 10^{-3}$ | $1.2 \times 10^{-2}$ |
| Comparative Example 2 | PET 100μm | Treated | Polyester Urethane | $TiO_2$ | 10.0 | <$5.0 \times 10^{-4}$ | $3.3 \times 10^{-2}$ |

LAMINATE, GAS BARRIER FILM, AND MANUFACTURING METHOD THEREFOR

CROSS REFERENCE

The present application claims the benefit of priority on from Japanese Patent Application No. 2012-230658, filed in Japan on Oct. 18, 2012, and the description of which is incorporated herein.

TECHNICAL FIELD

The present invention relates to a laminate in which an atomic layer deposition film is formed on an outer surface of a base material, a gas barrier film that is formed by the laminate, and a method for manufacturing therefor.

BACKGROUND ART

Methods for forming a thin film on a surface of an object using a gas-phase state in which a substance is in a state capable of moving on an atomic/molecular level in a manner similar to gas can be largely classified into chemical vapor deposition (CVD) and physical vapor deposition (PVD).

Representative methods of PVD can include a vacuum deposition method, a sputtering method, and the like. In particular, although the apparatus cost is high, the sputtering method is generally capable of forming a high-quality thin film having excellent uniformity in terms of film quality and film thickness, and the sputtering method is widely applied to display devices such as liquid crystal displays, and the like.

In addition, CVD is a method in which a starting material gas is introduced into a vacuum chamber, a single type or two or more types of gas are decomposed or reacted on a substrate using thermal energy, and a solid-state thin film is thereby grown. Here, there are also methods in which plasma or catalytic reactions are concomitantly used to promote reaction during film formation and to reduce reaction temperature. These methods are respectively referred to as plasma enhanced CVD (PECVD), Cat-CVD, and the like. Such methods of CVD are primarily applied to the manufacturing processes for semiconductor devices, such as formation of a gate insulator film, because there are few film formation defects.

Furthermore, atomic layer deposition (ALD) has been gaining attention in recent years. The ALD method is a method in which film formation of a substance adsorbed on a surface is performed a layer at a time on an atomic level by chemical reaction being induced on the surface. The ALD method is classified within CVD. The ALD method and typical CVD are differentiated by the following points. Typical CVD is a method in which a thin film is formed by a single gas or a plurality of gases being used at the same time and reacted on a substrate. Instead, the ALD method alternately uses a high activity gas, referred to as a precursor (such as tri-methyl aluminum (TMA)), and a reactive gas (the reactive gas may also be referred to as a precursor in the ALD method). Therefore, the ALD method is a special film formation method in which a thin film is grown a layer at a time on an atomic level through adsorption on a substrate surface and chemical reaction following adsorption.

A specific film formation method of the ALD method will be described hereafter. The ALD method is a film formation method that takes advantage of a phenomenon that occurs in surface adsorption on a substrate, that is, a so-called self-limiting effect, in which, after the surface is covered by a certain type of gas, no further adsorption of the gas occurs. As a result of the self-limiting effect, after only a single layer of the precursor (first precursor) is adsorbed on the substrate, the unreacted precursor is discharged. Next, the reactive gas (second precursor) is introduced onto the substrate, and only a single layer of a thin film having a desired composition is deposited on the substrate by oxidizing or reducing the precursor. The reactive gas is then discharged. The above-described process comprises a single cycle, and the thin film is grown by repetition of this cycle. Therefore, in the ALD method, the thin film grows in a two dimensional manner. In addition, the ALD method is known to produce fewer film formation defects compared to the conventional vacuum deposition method, sputtering method, and the like. Moreover, the ALD method is known to produce fewer film formation defects even compared to typical CVD and the like.

Therefore, application of the ALD method to a wide range of fields, such as the packaging industry for food products, pharmaceutical products, and the like, and the electronic component industry, is anticipated.

In addition, in the ALD method, a method is known in which plasma is used to activate a reaction in the process for decomposing the second precursor and reacting the second precursor with the first precursor that is adsorbed on the substrate. This method is referred to as plasma enhanced ALD (PEALD) or simply plasma ALD.

The technique of the ALD method itself was proposed in 1974 by Dr. Tuomo Sumtola of Finland. Because the ALD method generally enables formation of high-quality, high-density thin films, application of the ALD method in the semiconductor industry, such as for gate insulator films, is advancing. The ALD method is disclosed in the International Technology Roadmap for Semiconductors (ITRS). Furthermore, the ALD method is known to not produce a slanted shadow effect (a phenomenon in which variations in film formation occur as a result of sputtering particles being incident on the substrate surface at an angle) compared to other film formation methods. Therefore, in the ALD method, a precursor can be applied to a substrate or the like as long as a gap allowing infiltration of gas is present. Therefore, application of the ALD method is also anticipated in uses related to microelectromechanical systems (MEMS) for the purpose of coating three dimensional structures, in addition to coating lines and holes on a substrate that has a high aspect ratio in which the ratio of depth and width is large.

However, the ALD method also has the following disadvantages. Specifically, special materials are used to perform the ALD method, so the cost increases as a result of the use of special materials, and the like. Moreover, the greatest disadvantage of the ALD method is that the film formation speed is low. For example, in the ALD method, the film formation speed is lower by about 5 to 10 times compared to film formation methods such as typical vacuum deposition, sputtering, and the like.

There are various materials that serve as targets on which thin films are formed by the ALD method using the film formation method such as that described above. For example, as thin-film formation targets for the ALD method, there are small, plate-shaped substrates such as wafers and photomasks, inflexible substrates having a large surface area such as glass plates, flexible substrates having a large surface area such as films, and the like. Corresponding to the intended uses of such substrates, various methods for handling these substrates are being proposed and put into practical use in mass production facilities for forming thin films on these substrates, from the perspective of cost, ease-of-handling, film formation quality, and the like.

For example, in an example in which a film is formed on a wafer, a single-wafer film formation apparatus is known in which a single substrate is fed into the film formation apparatus and a film is formed. Thereafter, the substrate is replaced with the next substrate and film formation is performed again. A batch-type film formation apparatus is also known in which a plurality of substrates are collectively set and the same film formation is performed on all wafers.

In addition, in an example in which film formation is performed on a glass substrate or the like, an inline-type film formation apparatus is known in which film formation is simultaneously performed while substrates are successively carried to a section serving as the source of film formation. Furthermore, mainly in the case of flexible substrates, a so-called roll-to-roll web coating film formation apparatus is known, which is a method in which a substrate is unwound from a roll, film formation is performed while the substrate is being carried, and the substrate is wound onto another roll. The latter also includes a web coating film formation apparatus in which, not only flexible substrates, but also substrates subject to film formation are placed on a flexible sheet or a partially flexible tray that is capable of continuously carrying the substrate, and continuous film formation is performed.

In the film formation methods and substrate handling methods of any of the film formation apparatuses, a combination of film formation apparatuses that have the highest film formation speed is used through determination based on cost, quality, ease-of-handling, and the like.

As related technology, a technique is disclosed in which a gas permeation barrier layer is formed on a plastic substrate or a glass substrate by atomic layer deposition being performed on the plastic substrate or the glass substrate by the ALD method (for example, refer to PTL 1). In this technique, a light-emitting polymer is mounted on a plastic substrate that has flexibility and light transmittance, and atomic layer deposition is performed by the ALD method on the top surface and side surfaces of the light-emitting polymer (top-coating is performed). It is known that, as a result, coating defects can be reduced and a light-transmissive barrier film that is capable of significantly reducing gas permeation with a thickness of several tens of nanometers can be actualized.

In addition, in recent years, as products obtained through the ALD method, products for the purpose of imparting flexibility and reducing weight that are related to the back sheet and front sheet of solar cells, displays and lighting such as organic electroluminescent (EL) elements, and the like, and products, regardless of field, that are provided with high-barrier films of $10^{-3}$ g/(m$^2$·day) or lower and serve as glass substrate substitutes are desired. Furthermore, in high-barrier films, barrier films that are resistant to temperatures and moisture are desired.

Ordinarily, in a gas barrier film, a metal coating or a metal oxide coating is formed on at least one surface (first surface) of a base material using the CVD method, sputtering method, or sol-gel method. However, when heat resistance and moisture resistance of the base material is low, various problems occur when a base material having a high thermal expansion coefficient (also referred to, in particular, as a linear expansion rate or a linear expansion coefficient), a base material having a low glass transition point, and the like are used. For example, when a product using such a base material is exposed to stress, such as heat, during reliability testing of the product, the metal coating or the metal oxide coating formed on the base material may deteriorate as a result of expansion, contraction, and deformation, and defects may increase. Therefore, a substrate using a base material such as those described above may not be able to maintain the desired gas barrier properties.

Therefore, in light of problems such as those described above, for example, a gas barrier film has been proposed in which a metal oxide film that serves as the gas barrier film is formed by the CVD film or the sol-gel method on a base material having a low thermal expansion rate, thereby imparting resistance to temperatures and moisture (for example, refer to PTL 2). However, in the gas barrier film formed on the base material by the CVD method or the sol-gel method, only a water vapor transmission rate (WVTR) in the $10^{-2}$ g/(m$^2$·day) order can be obtained. Therefore, the desired high-barrier film is difficult to obtain.

In addition, as described above, because the thin film formed by the ALD method grows in a two-dimensional manner and has fewer film formation defects compared to the CVD method, the sputtering method, and the like, obtainment of a high-barrier film can be anticipated. Furthermore, when film formation is performed by the ALD method, because the precursor, such as an organic metal, attaches to the functional groups or the like on the base material surface, the state of the base material surface on which the film is formed is also important in obtaining a thin film with few film formation defects. Therefore, adsorption of the precursor, such as an organic metal, on the base material surface is required to be effectively performed and a base material having a low linear expansion coefficient is required to be selected. Furthermore, a layer structure that is provided with the desired characteristics is required to be formed.

CITATION LIST

Patent Literature

[PTL 1] JP-A-2007-516347
[PTL 2] JP-A-2003-327718

SUMMARY OF INVENTION

Technical Problem

As described above, laminates that are provided with an atomic layer deposition film on the outer surface of a base material by the ALD method have been hitherto known widely. Furthermore, such laminates are preferentially used in gas barrier films that have gas barrier properties, and the like. Through research by the inventors, it has been found that, because the atomic layer deposition film (ALD film) is laminated on a polymer base material in the laminates known conventionally, the likelihood is high that the growth mode of the atomic layer differs between when the base material is an inorganic crystal such as a conventional Si wafer and when the base material is the above-described laminate. When a material obtained through oxidation treatment of a Si wafer is used as the substrate, the adsorption sites on the substrate on which the precursor is adsorbed are present at a density that is substantially equivalent to the crystal lattice. At this time, in many cases, when several cycles of atomic layer deposition are performed, film growth of the atomic layer progresses in a two-dimensional growth mode after a period in which the atomic layer grows three-dimensionally (island growth). However, in the case of the polymer base material, it has been found that the distribution density of the sites on which the precursor is adsorbed is low. The atomic layer grows three dimensionally and becomes larger using the precursors that have been adsorbed in isolation as cores, thereby resulting in contact between adjacent cores and formation of a continuous membrane. In other words, in the atomic layer growth onto a polymer base material, the period of three-dimensional growth of the atomic layer is long, and a continuous membrane is formed. The period before a compact film is formed by two-dimensional growth of the atomic layer is long. Therefore, compact portions of two-dimensional growth in the atomic layer deposition film decrease. From the perspective of gas barrier properties, decrease in the portions of two-dimensional growth in the atomic layer is not preferable. In other words, the conventional laminate may not have the ideal gas barrier properties even when the ALD method is used.

Furthermore, through research by the inventors, it has become clear that, when heat resistance and moisture resistance are low in the base material on which the thin film is formed by the ALD method, deterioration of the gas barrier properties of the laminate is significant. In particular, when the thermal expansion coefficient of the base material is high, the base material significantly expands and contracts due to temperature changes during the formation process of the barrier film and when a high-temperature, high-humidity test for reliability testing and the like are performed. It has become clear that, as a result, adhesion between the thin film formed by the ALD method and the base material decreases, defects in the thin film itself increase, and the gas barrier properties of the laminate significantly deteriorate.

The present invention has been achieved in light of such circumstances. An object of the present invention is to provide a laminate that has high gas barrier properties and excellent heat resistance, a gas barrier film formed by the laminate, and a method for manufacturing the laminate and the gas barrier film.

Solution to Problem

A laminate according to a first aspect of the present invention includes: a base material; an undercoat layer that is formed on at least a portion of an outer surface of the base material, the undercoat layer containing an organic polymer having functional groups, the undercoat layer being formed into a membrane shape or a film shape; and an atomic layer deposition film that contains a precursor that serves as a starting material, the atomic layer deposition film being formed so as to cover a surface of the undercoat layer, at least some of the precursor bonding with the functional groups in the atomic layer deposition film. The linear expansion coefficient of a layered film including the base material and the undercoat layer is about $1.0\times10^{-5}$/K or higher and about $8.0\times10^{-5}$/K or lower.

In addition, a main component of the undercoat layer is preferably an organic polymer.

The organic polymer preferably has a binder and an inorganic substance, and is preferably formed so that at least some of the precursor serving as the starting material of the atomic layer deposition film bonds with the binder and the inorganic substance.

The functional groups in the organic polymer preferably include a functional group having an oxygen atom or a functional group having a nitrogen atom.

The functional group containing an oxygen atom is preferably one type or more selected from a group comprising an OH group, a COOH group, a COOR group, a COR group, an NCO group, and a $SO_3$ group, and the functional group containing a nitrogen atom is preferably an $NH_X$ group in which X is an integer.

The functional group of the organic polymer preferably includes an atom having an unshared electron pair or an unpaired electron.

The binder is preferably a compound of one or more type selected from a group comprising organic binders, inorganic binders, and hybrid binders of an organic and inorganic mixture.

The undercoat layer preferably includes a first surface that is in contact with the base material and a second surface that is provided opposite of the first surface, and at least a portion of the first surface and the second surface is preferably surface treated by plasma treatment, corona treatment, or hydrolysis treatment.

A gas barrier film according to a second aspect of the present invention is that in which the above-described laminate according to the first aspect is formed into a film shape.

A method for manufacturing a laminate according to a third embodiment is a method in which: a base material is placed; an undercoat layer is formed on at least a portion of an outer surface of the base material, the undercoat layer having a linear expansion coefficient of from about $1.0\times10^{-5}$/K or higher and about $8.0\times10^{-5}$/K or lower, the undercoat layer containing an organic polymer, the undercoat layer having a membrane shape or a film shape; surface treatment is performed on at least a portion of a first surface in a thickness direction of the undercoat layer that is in contact with the base material and a second surface provided opposite of the first surface; and an atomic layer deposition film is formed on the second surface so that a precursor that is a starting material of the atomic layer deposition film bonds with functional groups of the organic polymer contained in the undercoat layer.

An inorganic compound is preferably added to the organic polymer.

The surface treatment is preferably plasma treatment, corona treatment, or hydrolysis treatment In a method for manufacturing a gas barrier film according to a fourth aspect of the present invention, a laminate manufactured by the method for manufacturing a laminate according to the third aspect is formed into a film shape Advantageous Effects of Invention In the laminate according to the first aspect of the present invention, the two-dimensional atomic layer deposition film is formed into a film in which atoms are densely bonded in the planar direction. Therefore, there are fewer gaps through which gas permeates in the film thickness direction than in the past. As a result, gas barrier properties of the laminate and the gas barrier film can be further improved. Furthermore, through use of a base material that has little expansion and contraction variation caused by heat, the amount of expansion and contraction in the base material caused by heat during the formation process of the barrier film or during reliability testing can be suppressed, thereby enabling a highly reliable barrier film to be provided.

BRIEF DESCRIPTION OF THE DRAWINGS

FIG. 11 is a characteristics chart of a relationship between pre-processing conditions of $TiO_2$ in an atomic layer deposition film (ALD film) and gas barrier properties according to the embodiment of the present invention;

FIG. 12 is a diagram of a comparison of water vapor transmission rates between laminates according to examples of the present invention having a gas barrier layer and using an undercoat having a low linear expansion coefficient, and laminates of comparative examples having a gas barrier layer and using an undercoat having a high linear expansion coefficient;

DESCRIPTION OF EMBODIMENTS

<<Overview of the Embodiment>>

Figure 1:
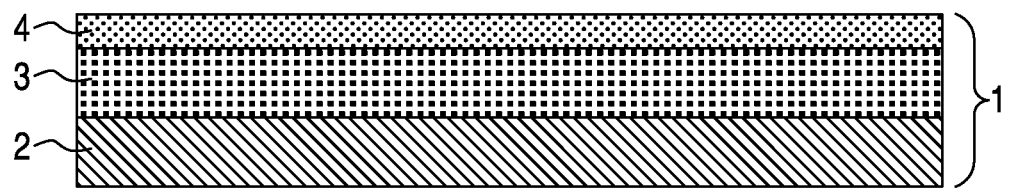
FIG. 1 is a cross-sectional view of a configuration of a laminate according to an embodiment of the present invention.

A laminate according to a first embodiment of the present invention has an undercoat layer between a base material and an atomic layer deposition film. The undercoat layer is a layer that contains an organic polymer, and the organic polymer has bonding sites on which the organic polymer and a precursor in the atomic layer deposition film bond. In other words, the organic polymer contained in the undercoat layer has numerous functional groups as the bonding sites that easily bond with the precursor in the atomic layer deposition film. Therefore, a precursor that is bonded with a functional group of the organic polymer and another precursor adjacent to the precursor are bonded so as to be cross-linked with each other. Consequently, a two-dimensional atomic layer deposition that grows in the planar direction of the undercoat layer is formed. As a result, gaps through which gas permeates are not readily formed in the film thickness direction of the laminate, and a laminate having high gas barrier properties can be achieved. An inorganic substance may be dispersed in the undercoat layer. That is, as a result of an inorganic substance being added to the undercoat layer, adsorption density of the precursor in the atomic layer deposition film can be further improved.

Furthermore, the expansion and contraction of the laminate can be controlled by combining the base material and the undercoat layer so that a layered film composed of the base material and the undercoat layer (a layered film comprising the base material and the undercoat layer) has a thermal expansion coefficient (in particular, a linear expansion coefficient) that is lower than a predetermined value.

For example, the laminate is controlled so that the linear expansion coefficient of the layered film is lower than the predetermined value by using a material that has a low linear thermal expansion coefficient in the base material or the undercoat layer. For example, the linear expansion coefficient of a layered film having a low linear expansion coefficient can be obtained by combining a base material that uses a material having a relatively high linear expansion coefficient, such as polyethylene terephthalate (PET), polyethersulfone (PES), polyethylene (PE), polypropylene (PP), nylon-6, or polyvinyl alcohol (PVA), and an undercoat layer that uses a material having a low linear expansion coefficient, such as polyimide, polyamide-imide, polyetheretherketone, or polybenzoxazole. Specifically, the linear expansion coefficient of the layered film is preferably about $8.0 \times 10^{-5}$/K or lower. However, all that is required is that the material has a low linear expansion coefficient, and the base material and the undercoat layer are not limited to the combinations described above. As a result, expansion and contraction variations caused by heat after film formation of the ALD barrier film (in other words, the ALD film) are suppressed, and durability (heat resistance and moisture resistance) of the laminate can be improved.

<<Approach to the Present Invention>>

A laminate including an atomic layer deposition film that is produced by the atomic layer deposition method (ALD method) is commercially manufactured as an electronic component substrate, such as a glass substrate or a silicon substrate, for thin-film inorganic EL, displays, semiconductor memories (dynamic random access memory (DRAM)), and the like. Meanwhile, the base material of the laminate according to the first embodiment of the present invention is a polymer base material that has flexibility. However, the process of the ALD method performed on a polymer base material is currently not being researched in detail. Therefore, in the research related to the first embodiment of the present invention, it has been surmised that, when a polymer base material is used, the atomic layer deposition film will grow on the polymer base material in a manner similar to that in an electronic component substrate. An approach to the laminate according to the first embodiment of the present invention was attempted, taking into consideration the relationships among the growth process of the atomic layer deposition film on the polymer base material, the linear expansion coefficient of the layered film in which the undercoat layer is formed on the base material, and the gas barrier properties of the laminate after undergoing a pressure cooker test (PCT) process.

The atomic layer deposition film on an electronic component substrate is generally considered to grow two-dimensionally. However, it has become clear that, in actuality, the atomic layer deposition film on a polymer base material (such as polyethylene terephthalate (PET)) does not grow two-dimensionally. In other words, in thin-film formation of the atomic layer deposition film on the polymer base material by the process of the conventional ALD method, the desired two-dimensional growth may not be achieved by the ALD method.

The main reasons therefor are considered found in the "density of adsorption sites" and the "arrangement of adsorption sites" on the polymer base material. The adsorption site refers to a site on a substrate (base material) on which a precursor is adsorbed. Regarding such reasons, it can be considered that the performance of the atomic layer deposition film cannot be sufficiently exhibited when the film thickness of the atomic layer deposition film is thin. Therefore, the atomic layer deposition film is required to be formed so that the film thickness of the atomic layer deposition film is 2 nm or more, or the atomic layer deposition film is required to be formed so that the atomic layer deposition film is a laminate of 20 atomic layers or more.

Regarding the density of the adsorption sites for the precursor in the atomic layer deposition film, which is the first reason, the following can be considered. That is, a first step in the process of the ALD method according to the embodiment of the present invention is that a gaseous precursor (tri-methyl aluminum (TMA)) or a metal-containing precursor, such as a $TiCL_4$, is chemically adsorbed on the surface of the polymer base material (may also be referred to, hereafter, as simply a base material). The reactivity between the precursor and the functional groups of the base material, and the density of the functional groups at this first step significantly affect chemical adsorption.

For example, in the case of a polymer, as shown in the following formula (1), the precursor in the atomic layer deposition film is reversibly adsorbed on the adsorption sites on the polymer base material.

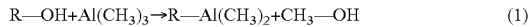

$$R\text{—}OH + Al(CH_3)_3 \rightarrow R\text{—}Al(CH_3)_2 + CH_3\text{—}OH \quad (1)$$

In other words, in formula (1), the OH group that is present in a polymer chain in the polymer base material is adsorbed on the adsorption area of the precursor.

The precursor in the atomic layer deposition film can attach to a functional group, such as the OH and COOH groups, in the polymer chain, but does not readily attach to non-polar portions such as the alkyl group. Therefore, to increase the adsorptive power of the precursor, plasma treatment is performed on the polymer base material using gas that contains $O_2$ or $N_2$, and functional groups are introduced to the surface of the polymer base material. However, depending on the type of polymer used in the polymer base material, the plasma treatment may cause breakage of the polymer chains in the polymer base material. Physical strength decreases in areas in which such breakage of the polymer chain has occurred. Furthermore, the breakage portion of the polymer chain forms a weak boundary layer (a boundary layer having weak adhesive power), and leads to reduced adhesive strength of the polymer base material. Therefore, the plasma treatment for introducing functional groups to the surface of the polymer base material has limitations in terms of adhesive strength.

In addition, when the density of the functional groups in the polymer base material is low, the adsorption sites on which the precursor is adsorbed are arranged in an isolated state. When the sites on which the precursor is adsorbed are arranged in an isolated state on the polymer base material in this way, the atomic layer deposition film grows three-dimensionally using the sites on which the precursor is adsorbed as cores. In other words, when the density of the sites on which the precursor is adsorbed on the polymer base material is low, the atomic layer deposition film spreads three-dimensionally, and because the precursor becomes unevenly adsorbed in areas in which the OH group and the like are present, the atomic layer deposition film grows in columnar shapes around isolated cores.

Next, regarding the arrangement of the adsorption sites for the precursor on the polymer base material (that is, the dispersion of the precursor adsorbed on the adsorption sites on the polymer base material), which is the second reason, the following can be considered. It is generally known that crystalline regions and amorphous regions are intermingled in a polymer film. Therefore, the amorphous region has space, referred to as free volume, in which a polymer chain is not present, and gas is dispersed and transmitted through this space. In addition, a gaseous precursor is also transmitted through the free-volume space until being adsorbed on the adsorption sites on the polymer base material.

Moreover, even when a polymer in which the adsorption sites are present in sufficient density is used in an undercoat, the gas barrier properties of the laminate may deteriorate if a polymer having a high linear expansion coefficient is used. In other words, when the linear expansion coefficient of the undercoat is high, the gas barrier properties of the laminate deteriorates when the process for forming the laminate and the PCT process serving as an indicator for reliability are performed, as a result of decrease in adhesive strength between the undercoat and the atomic layer deposition film and increase in defects in the atomic layer deposition film.

For the above-described reasons, in the process of the ALD method performed on polymer base materials, the precursor is dispersed inside the polymer base material from the surface, attaches to the functional groups that are three-dimensionally interspersed within the polymer base material, and the adsorption sites serve as the cores of the atomic layer deposition film. Because the cores are three-dimensionally interspersed, the growth mode is a three-dimensional growth mode (the atomic layer deposition film grows three-dimensionally) until a certain core comes into contact with an adjacent core and a continuous membrane is formed. Therefore, this means that the period before the continuous membrane is formed and the atomic layer deposition film becomes a compact film through two-dimensional growth is long, and compact portions in the atomic layer deposition film formed by two-dimensional growth of the atomic layer deposition film decrease. Therefore, gas passes through the gaps in the atomic layer deposition film. Furthermore, gas passes through the free-volume space. Consequently, the laminate cannot obtain high gas barrier properties.

Therefore, according to the first embodiment of the present invention, an undercoat layer that contains an organic polymer is provided on the polymer base material to actualize three points: (1) increased density of the adsorption sites for the precursor on the polymer base material, (2) inhibition of the dispersion of the precursor into the high polymer base material, and (3) reduction of the linear expansion coefficient of the layered film composed of the base material and the undercoat layer. That is, to arrange the sites on which the precursor is adsorbed on the surface of the polymer base material in a two-dimensional manner and with high density, the undercoat layer containing an organic polymer is provided on the polymer base material before the process of the ALD method. To further increase the density of the sites on which the precursor is adsorbed on the polymer base material, an inorganic substance is added to the undercoat layer. As a result of the undercoat layer containing an organic polymer being provided on the polymer base material in this way, the gas containing the precursor does not readily disperse into the undercoat layer.

Furthermore, in addition to increasing the density of the sites on which the precursor is adsorbed and inhibiting dispersion of the precursor into the polymer base material, the linear expansion coefficient is reduced. Specifically, the base material and the undercoat are combined so that the linear expansion coefficient of the layered film composed of the base material and the undercoat layer (the layered film comprising the base material and the undercoat layer) is about $8.0 \times 10^{-5}$/K or lower. As a result, adhesion and reliability of the atomic layer dispersion film under thermal stress can be improved, and reduction in gas barrier properties can be prevented.

To impart high durability, the linear expansion coefficient of the layered film is preferably about $5.0 \times 10^{-5}$/K or lower. In addition, depending on the product to which the invention is applied, the linear expansion coefficient of the layered film may be within the range from about $1.0 \times 10^{-5}$/K to about $8.0 \times 10^{-5}$/K.

Embodiments

<Configuration of the Laminate>

FIG. 1 is a cross-sectional view of a configuration of the laminate according to the first embodiment of the present invention. As shown in FIG. 1, a laminate 1 includes: a base material 2 that is formed by a polymer material; an undercoat layer (referred to, hereafter, as a UC layer) 3 that has a low linear expansion coefficient and is formed in a membrane shape or a film shape on the surface of the base material 2; and an atomic layer deposition film (referred to, hereafter, as an ALD film) 4 that is formed on a surface (first surface) that is in contact with the base material 2, of the two surfaces of the UC layer 3 in the thickness direction, and a second surface that is opposite the first layer. The UC layer 3 contains an organic polymer material, ensures the sites on which the precursor in the ALD film 4 is adsorbed, and has a low linear expansion coefficient. In other words, the organic polymer contained in the UC layer 3 has functional groups to which the precursor in the ALD film 4 easily attaches. Therefore, as a result of the precursor in the ALD film 4 bonding in a cross-linking manner with the functional groups of the organic polymer contained in the UC layer 3, the ALD film 4 is formed into a membrane shape so as to cover the UC layer 3.

Here, to ensure the adsorption sites on the base material 2 by forming the UC layer 3 that contains the organic polymer, an organic polymer that has functional groups to which the precursor in the ALD film 4 easily attaches is required to be selected. In addition, an organic polymer in which the density of the functional groups is high is required to be selected. Furthermore, the surface of the organic polymer is modified and the functional groups in the organic polymer are increased in density as a result of surface treatment being performed on the base material 1 by plasma treatment or hydrolysis treatment. In addition, adsorption density of the precursor can be improved by an inorganic compound being added to the organic polymer used in the UC layer 3, and the linear expansion coefficient of the UC layer 3 can also be controlled depending on the type and the quantity of the inorganic compound to be added.

Figure 2A:
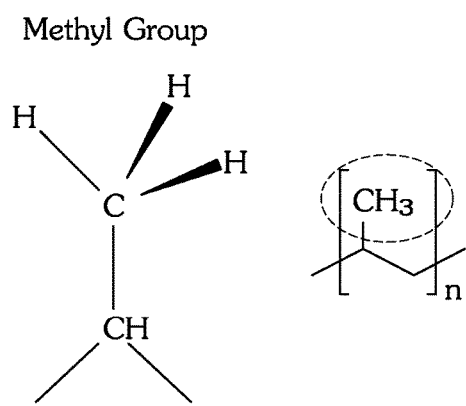
FIG. 2A shows a methyl group as a chemical formula of a functional group of an organic polymer according to the embodiment of the present invention.
Figure 2B:
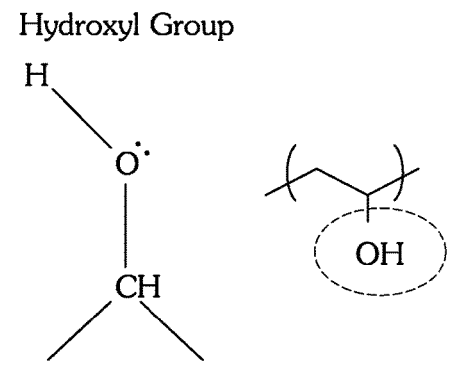
FIG. 2B shows a hydroxyl group as a chemical formula of a functional group of an organic polymer according to the embodiment of the present invention.
Figure 2C:
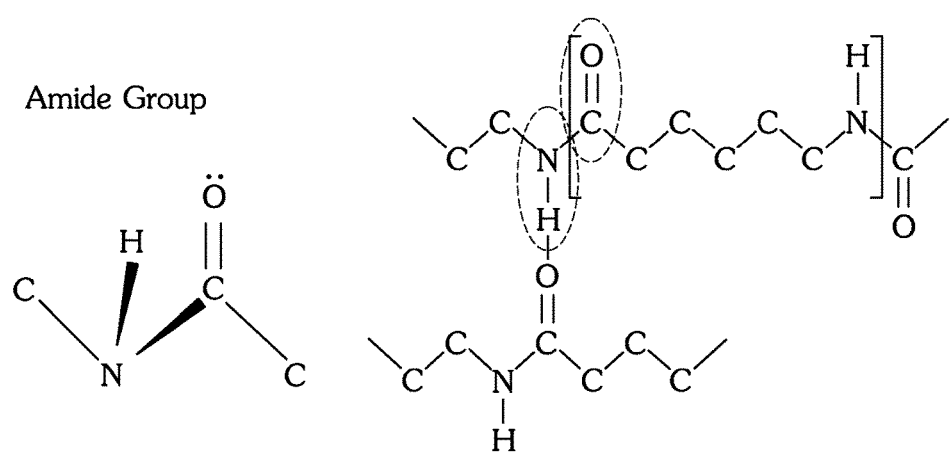
FIG. 2C shows an amide group as a chemical formula of a functional group of an organic polymer according to the embodiment of the present invention.

Here, the organic polymer having functional groups to which the precursor in the ALD film 4 easily attaches will be described. FIG. 2A to C show chemical formulas of functional groups of organic polymers. FIG. 2A shows a methyl group, FIG. 2B shows a hydroxyl group, and FIG. 2C shows an amide group.

As shown in FIG. 2A, when polypropylene (PP) which has a methyl group as the functional group is used in the undercoat, the initial growth of the film formation quantity of the ALD film 4 (that is, the adsorption speed of the precursor) is slow. In other words, when PP is used as the material of the organic polymer in the undercoat, the precursor is not readily adsorbed because the functional group is a methyl group. Therefore, PP is not preferable as the material of the organic polymer used in the undercoat.

When polyvinyl alcohol (PVA) which has a hydroxyl group, such as that shown in FIG. 2B, as the functional group is used as the material of the organic polymer in the undercoat layer, the initial growth of the film formation quantity of the ALD film 4 (that is, the adsorption speed of the precursor) is fast. In other words, when PVA is used as the material of the organic polymer in the undercoat layer, the precursor is easily adsorbed because the functional group is a hydroxyl group. Therefore, PVA can be used as the material of the organic polymer used in the undercoat.

When nylon-6 which has the amide group, such as that shown in FIG. 2C, as the functional group is used as the material of the organic polymer in the undercoat, the initial growth of the film formation quantity of the ALD film 4 (that is, the adsorption speed of the precursor) is especially fast. In other words, when nylon-6 is used as the material of the organic polymer in the undercoat, the precursor is very easily adsorbed because the functional group is the amide group. Therefore, nylon-6 is preferable as the material of the organic polymer used in the undercoat.

However, when durability such as heat resistance is taken into consideration, it is not enough to simply have a functional group such as that described above. A resin having a low linear expansion coefficient is also required to be selected. In the above-described organic polymers, polyurethane resin, nylon-6, and the like, which have linear expansion coefficients that are higher than about $8.0 \times 10^{-5}$/K, have high linear expansion coefficients and large amounts of expansion and contraction variations due to heat. Therefore, when polyurethane resin, nylon-6, and the like having linear expansion coefficients that are higher than about $8.0 \times 10^{-5}$/K are used, the gas barrier properties decrease due to deterioration even when the initial barrier properties can be ensured. In other words, the UC layer 3 that contains atoms that have unshared electron pairs or unpaired electrons (atoms that donate electrons), such as the hydroxyl group or the amide group, and that has a low linear expansion coefficient is preferably selected.

The organic polymer materials that have functional groups to which the precursor in the ALD film 4 easily attaches and that have low linear expansion coefficients can include, in addition to the foregoing, polyimide resin that has an imide group, polyethersulfone (PES) that has a sulfone group, polyethylene terephthalate (PET) that has an ester group, or the like.

Figure 3:
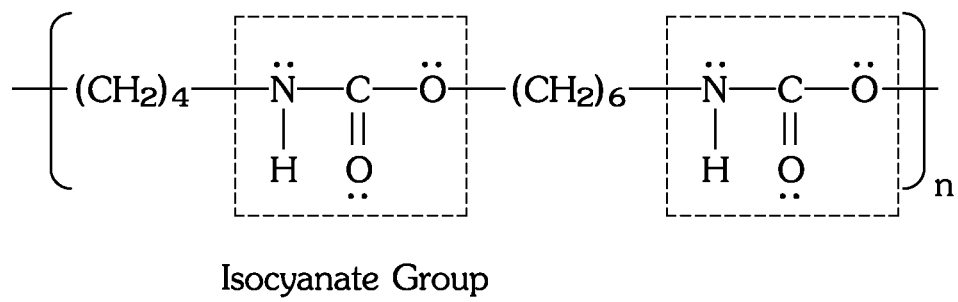
FIG. 3 shows a chemical formula of an isocyanate group which is a functional group of urethane resin according to the embodiment of the present invention.
Figure 4:
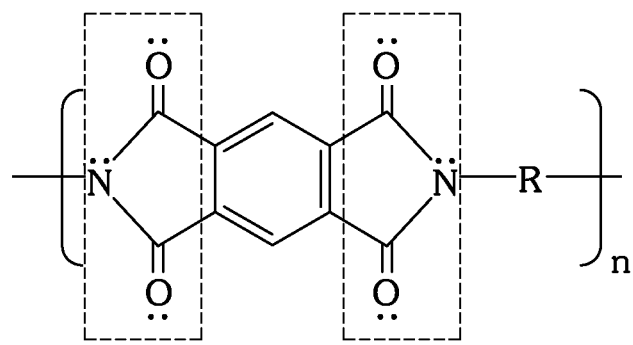
FIG. 4 shows a chemical formula of an imide group which is a functional group of polyimide resin according to the embodiment of the present invention.
Figure 5:
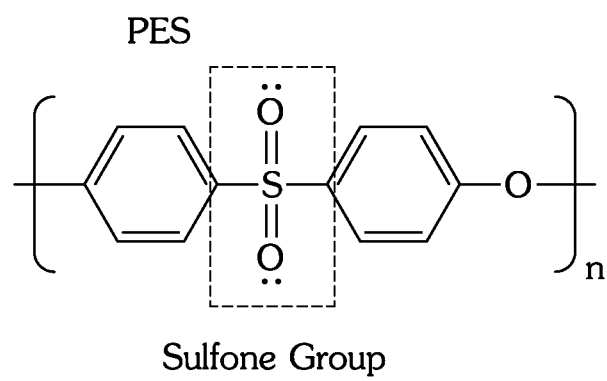
FIG. 5 shows a chemical formula of a sulfone group which is a functional group of polyethersulfone (PES) according to the embodiment of the present invention.
Figure 6:
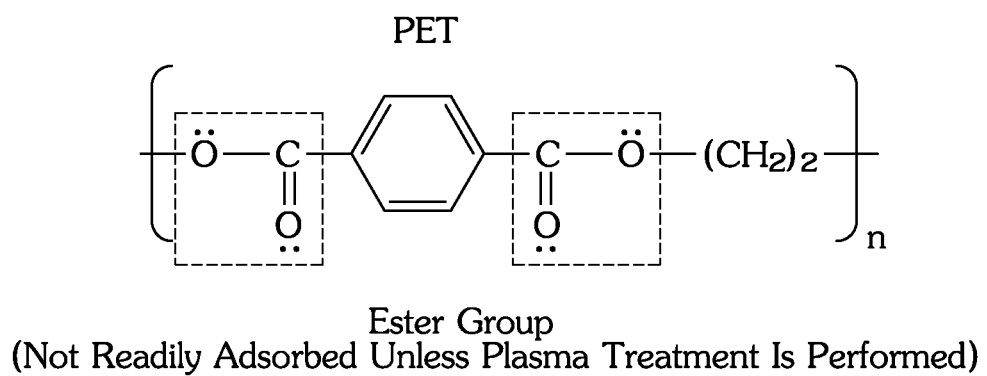
FIG. 6 shows a chemical formula of an ester group which is a functional group of polyethylene terephthalate (PET) according to the embodiment of the present invention.

FIG. 3 shows a chemical formula of an isocyanate group that is the functional group of urethane resin. FIG. 4 shows a chemical formula of an imide group that is the functional group of polyimide resin. FIG. 5 shows a chemical formula of a sulfone group that is the functional group of PES. FIG. 6 shows a chemical formula of an ester group that is the functional group of PET. When the ester group that is the functional group of PET is used as the functional group to which the precursor in the ALD film 4 easily attaches, the precursor in the ALD film 4 does not easily attach unless plasma treatment is performed.

That is, the functional group of the organic polymer contained in the UC layer 3 preferably has an O atom or an N atom. The functional groups that have O atoms can include a OH group, a COOH group, a COOR group, a COR group, a NCO group, a $SO_3$ group, or the like. The functional groups that have N atoms can include an $NH_X$ group (X being an integer). In addition to the foregoing, the functional group of the organic polymer contained in the UC layer 3 is merely required to contain an atom that has unshared electron pairs or unpaired electrons (dangling bonds), and interacts with the precursor by coordinate bonding, bonding by intermolecular force (van der Waal's force), hydrogen bonding, or the like. Still further, the functional group may have polarity.

Here, examples of a resin that has high adsorption of the precursor forming the ALD film and a very low value for the linear expansion coefficient, and specifically, the resins having a linear expansion coefficient of about $6.0 \times 10^{-5}$/K or lower can include PES, polyimide resin, polyamide-imide, polyetherimide, polyetheretherketone (PEEK), polysulfone (PSF), or the like. Because manufacturing of heat-resistant or low heat-contraction polyethylene terephthalate (PET) has recently become technically possible, PET can also be used as the undercoat having a low linear expansion coefficient. In addition, because PET has ether bonds, deterioration through hydrolysis has been viewed as a problem. However, because hydrolysis-resistant PET has recently been developed and PET having a linear expansion coefficient and a low heat-contraction rate exists, such PET also fall into the range capable of use as the UC layer.

Furthermore, in addition to resins having low values for the linear expansion coefficient, PVA and polyacrylate (PAR) that have moderate linear expansion coefficients (linear expansion coefficients of about $6.0 \times 10^{-5}$ to about $8.0 \times 10^{-5}$/K) can be used for purposes in which high durability is not required.

Moreover, even when a functional group that enhances adsorption of the precursor forming the ALD film is not provided, a desired undercoat may be provided. In other words, the desired undercoat can be provided by surface treatment, such as plasma etching (plasma treatment), corona treatment, or hydrolysis treatment, being performed on the surface of an organic polymer having a low linear expansion coefficient, thereby increasing the density of the functional groups in the organic polymer. Specifically, an organic polymer having an aromatic ring, such as polyphenylsulfone (PPS), is preferable. For example, an organic polymer is preferable in which the aromatic ring is opened by plasma etching or the like and an OH group or a COOH group is formed.

The liner expansion coefficient of the layered film composed of the base material and the undercoat layer may be changed depending on the glass transition temperature at which the organic polymer softens. For example, when a first glass transition temperature is Tg1 and a second glass transition temperature that is higher than the first transition temperature Tg1 is Tg2, the linear expansion coefficient of the layered film is set so that the linear expansion coefficient is α1 at Tg1 or lower. In addition, when Tg1<T<Tg2, the linear expansion coefficient is α2. Furthermore, the linear expansion coefficient is α3 at Tg2 or higher. Ordinarily, α1<α2<α3.

Figure 7:
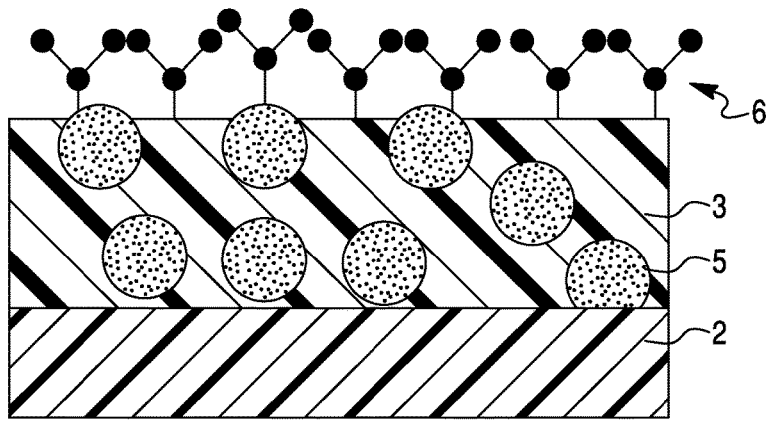
FIG. 7 is a schematic diagram of a bonding state of a precursor to an undercoat layer (UC layer) when an inorganic compound is added to the undercoat layer (UC layer) according to the embodiment of the present invention.

FIG. 7 is a schematic diagram of a bonding state of the precursor when an inorganic compound is added to the undercoat layer (UC layer) 3. In other words, as shown in FIG. 7, when an inorganic compound 5 is added to the UC layer 3 of the organic polymer to which the precursor 6 in the ALD film easily attaches, the precursor 6 not only bonds to the functional groups of the organic polymer in the UC layer 3 but also to the inorganic compound 5 added to the UC layer 3. As a result, adsorption density of the precursor 6 on the UC layer 3 further improves, and the gas barrier properties of the laminate can be further improved. In addition, because inorganic compounds have lower linear expansion coefficients than organic polymers, as a result of the inorganic compound being added to the organic polymer, the linear expansion coefficient is reduced, thereby significantly improving the durability of the laminate.

<Manufacturing Process of the Laminate>

Figure 8:
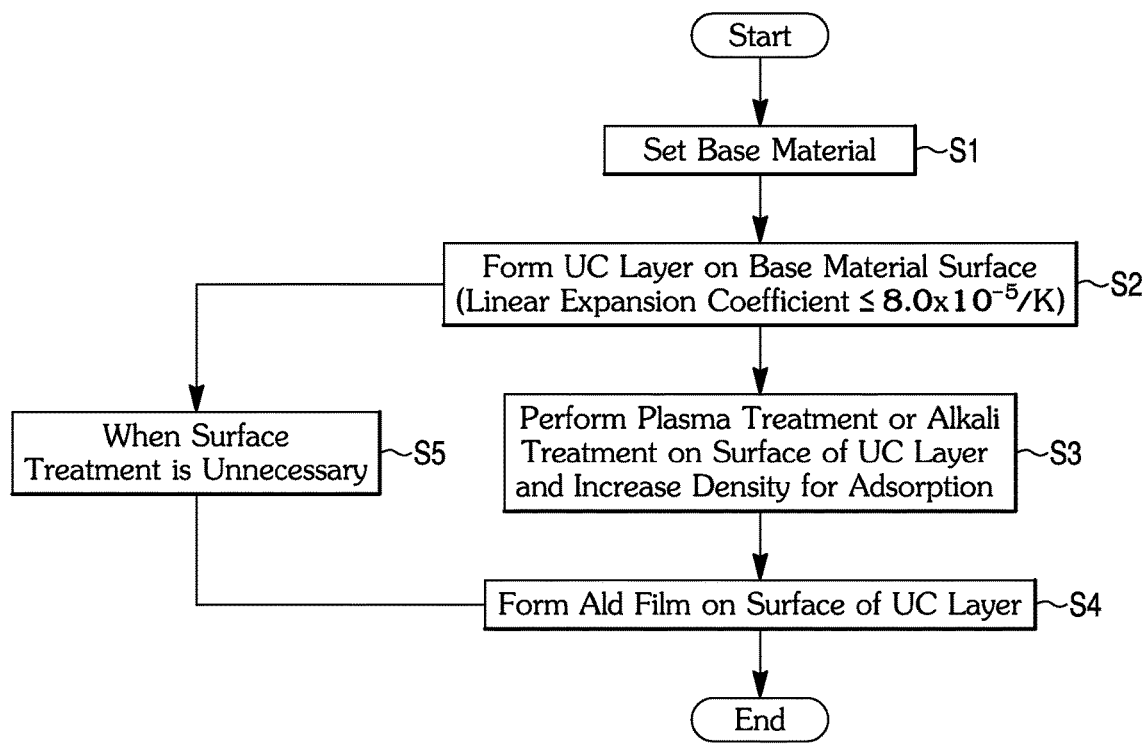
FIG. 8 is a flowchart summarizing a manufacturing process of the laminate according to the embodiment of the present invention shown in FIG. 1.

FIG. 8 is a flowchart of a summary of the manufacturing process of the laminate 1 shown in FIG. 1. In FIG. 8, first, the polymer base material 2 is placed in a thin-film formation apparatus (a semiconductor manufacturing apparatus or the like) (Step S1). Next, the membrane-like or film-like UC layer 3 that contains the organic polymer is formed on the surface of the base material 2 that has been placed in the thin-film formation apparatus. At this time, the linear expansion coefficient of the UC layer 3 in which the inorganic compound has been added to the organic polymer is about $8.0 \times 10^{-5}$/K or lower (Step S2).

Furthermore, surface treatment is performed on the top surface (that is, the surface (second surface of the UC layer 3) on the side opposite that of the surface (first surface of the UC layer 3) that is in contact with the base material 2) of the UC layer 3 formed at Step S2, and the density of the functional groups of the organic polymer contained in the UC layer 3 is increased. At this time, the density of the functional groups for adsorption of the precursor 3 is increased as a result of the top surface of the UC layer 3 undergoing a plasma treatment or an alkali treatment (Step S3). Then, the ALD film 4 is formed on the top surface of the UC layer 3 such that the precursor in the ALD film 4 bonds in a cross-linking manner with the functional groups of the organic polymer that has been increased in density at Step S3 (Step S4). At Step S3, the density of the functional groups of the organic polymer in the UC layer 3 can be increased by surface treatment of the UC layer 3 being performed by plasma treatment or hydrolysis treatment, as required. Here, when surface treatment of the UC layer 3 is unnecessary (Step S5), the ALD film 4 is formed on the top surface of the UC layer 3 (Step S4) immediately after the UC layer 3 is formed on the surface of the base material 2 (Step S2).

In this way, the ALD film 4 can be compactly formed on the surface of the UC layer 3 by the above-described process from Step S1 to Step S4. Therefore, the gas barrier properties of the laminate 1 can be improved. In particular, as a result of the density of the functional groups of the organic polymer in the UC layer 3 being increased by surface treatment of the UC layer 3, the gas barrier properties of the laminate 1 can be further improved. Furthermore, through use of the UC layer 3 having a low linear expansion coefficient on the surface of the base material 2, the amount of expansion and contraction in the laminate 1 caused by heat during the formation process of the barrier film and reliability testing can be suppressed. Therefore, a highly reliable gas barrier film can be formed.

Figure 9:
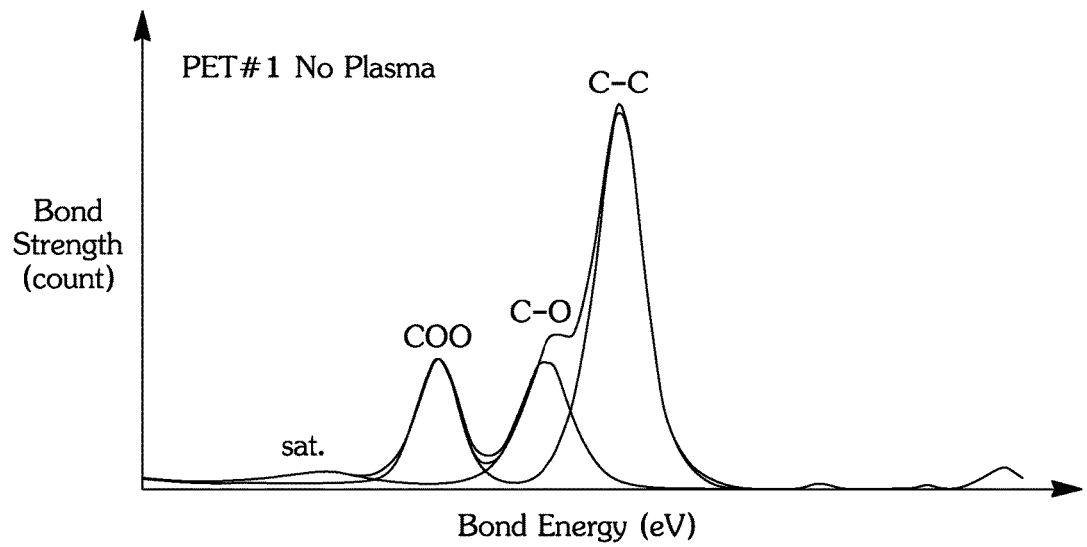
FIG. 9 shows surface characteristics of the undercoat layer (UC layer) according to the embodiment of the present invention in which plasma treatment is not performed, obtained by X-ray photoelectron spectroscopy.
Figure 10:
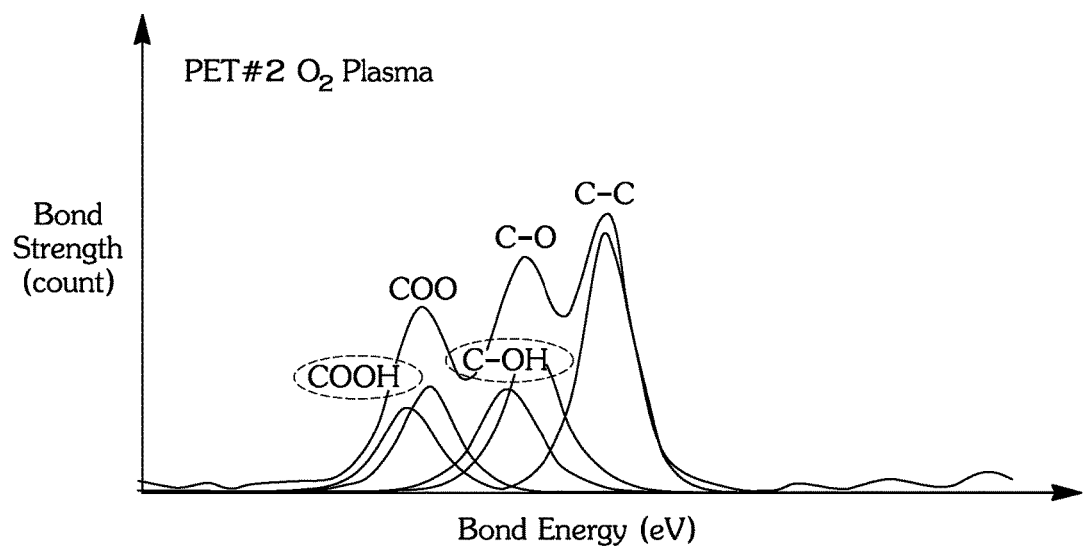
FIG. 10 shows surface characteristics of the undercoat layer (UC layer) according to the embodiment of the present invention in which plasma treatment is performed, obtained by X-ray photoelectron spectroscopy.

Here, effects achieved when surface treatment by plasma etching is performed on the UC layer 3 will be described in detail. FIG. 9 shows the surface characteristics of a PET base material on which plasma treatment has not been performed, obtained by X-ray photoelectron spectroscopy. In addition, FIG. 10 shows the surface characteristics of a PET base material on which plasma treatment has been performed, obtained by X-ray photoelectron spectroscopy. In both FIG. 9 and FIG. 10, the horizontal axis indicates bond energy (eV) and the vertical axis indicates bond strength (count). In other words, FIG. 9 is a characteristics chart of the functional groups on the surface layer when plasma treatment is not performed on "PET #1" (a resin containing polyethylene terephthalate) which is an organic polymer. FIG. 10 is a characteristics chart of the functional groups on the surface layer when $O_2$ plasma treatment is performed on "PET #1" which is an organic polymer.

When plasma treatment is not performed on "PET #1", as shown in FIG. 9, functional groups such as a C—C group, a C—O group, and a COO group appear on the surface layer. Meanwhile, when $O_2$ plasma treatment is performed on "PET #1", as shown in FIG. 10, the functional groups C—OH group and COOH group also appear in addition to the functional groups C—C group, C—O group, and COO group.

In other words, from the above-described results, it can be considered that, in addition to the base material, the polymer surface is modified as a result of plasma treatment being performed on the UC layer, and the density of the functional groups increases as a result of the appearance of the C—OH group and the COOH group, which were not present before the plasma treatment. As a result, the density of the precursor 6 in the ALD film 4 bonding in a cross-linking manner with the functional groups in the UC layer 3 increases, and the gas barrier properties of the laminate are further improved. In other words, as a result of the increase in the density of the functional groups, the density of the adsorption sites on which the precursor 6 in the ALD film 4 is able to bond increases. Therefore, the ALD film 4 grows two-dimensionally, and a compact film structure having high gas barrier properties can be obtained. This also applies to organic polymers other than PET.

FIG. 11 is a characteristics chart indicating the relationship between pre-processing conditions of $TiO_2$ in the ALD film and the gas barrier properties. The horizontal axis indicates plasma time (sec) and the vertical axis indicates the water vapor transmission rate (WVTR) [g/day/m$^2$]. As shown in FIG. 11, a laminate on which the $O_2$ plasma treatment has not been performed has a WVTR of 3.5 [g/day/m$^2$], and the WVTR sharply decreases when the $O_2$ plasma treatment is performed. In other words, when the $O_2$ plasma treatment is performed for about 10 sec or more, the WVTR becomes 1 [g/day/m$^2$] or lower. In this way, as a result of the $O_2$ plasma treatment being performed, the gas barrier properties can be further improved.

<Organic Polymer Used in the UC Layer>

Next, the organic polymer used in the UC layer will be described. Organic polymers are divided into aqueous organic polymers and solvent-based organic polymers depending on the solvent that is used. As aqueous organic polymers, polyvinyl alcohol, polyethylenimine, and the like can be given. In addition, as solvent-based organic polymers, acrylic ester, polyester acrylic, polyether acrylic, and the like can be given.

Next, further detailed specific examples of the organic polymer used in the UC layer will be described.

1. O Atom-Containing Resin Organic Polymers

The following materials can be given as materials that are preferable as organic polymers of O atom-containing resins. Hydroxyl group (OH group)-containing resins can include polyvinyl alcohol, phenolic resins, polysaccharides, or the like. Polysaccharides are, for example, cellulose, cellulose derivatives such as hydroxymethyl cellulose, hydroxyethyl cellulose, and carboxymethyl cellulose, chitin, and chitosan. In addition, carboxyvinyl polymers and the like are also preferable materials as carboxyl group (COOH group)-containing resins.

The organic polymers of O atom-containing resins other than the foregoing materials can include ketone group (CO group)-containing resins such as polyketones, polyether ketone, polyetheretherketone, and aliphatic polyketones. In addition, ester group (COO group)-containing resins such as polyester resins, polycarbonate resins, liquid crystal polymers, polyethylene terephthalate (PET), polybutylene terephthalate (PBT), polyethylene naphthalate (PEN), polybutylene naphthalate (PBN), and polytrimethylene terephthalate (PTT) can also be used. Other than the foregoing, epoxy resins, acrylic resins, and the like that contain the foregoing functional groups can also be used.

2. N Atom-Containing Resin Organic Polymers

The following materials can include as materials that are preferable as organic polymers of N atom-containing resins. Imide group (CONHCO group)-containing resins such as polyimides, polyetherimide, aliphatic polyimides, and solvent-soluble polyimides can be given. Regarding polyimides, aromatic polyimides are obtained from aromatic tetracarboxylic anhydrides and aromatic diamines. However, because the aromatic polyimide obtained from this method does not have transparency, for purposes (applications) requiring transparency, a transparent polyimide compound can be obtained using an aliphatic compound or an alicyclic compound as a substituent for the acid dianhydride and the diamine. In addition, the alicyclic carboxylic acids can include 1,2,4,5-cyclohexanetetracarboxylic acid, 1,2,4,5-cyclopentanetetracarboxylic dianhydride, or the like. Furthermore, the solvent-soluble polyimides can include γ-butyrolactone, N,N-dimethylacetamide, N-methyl-2-pyrrolidone, or the like.

3. S Atom-Containing Resin Organic Polymers

The following materials can be employed as materials used as organic polymers of S atom-containing resins. That is, sulfone group ($SO_2$)-containing resins such as polyethersulfone (PES), polysulfone (PSF), polyphenylsulfone (PPS) can be used. Among these resins, PES and PSF are materials having high heat resistance. Furthermore, polymer alloys, polybutylene terephthalate-based polymer alloys, polyphenylene sulfide-based polymer alloys, and the like can also be used as organic polymers. As the polymer alloys, the polymers described above may be combined to form a polymer composite (alloy, blend, or composite), as required.

<Additional Notes>

As described above, when an inorganic substance (inorganic compound) is added to the UC layer 3, adsorption density of the precursor 6 on the ALD film 4 is further improved. Here, the inorganic substance added to the UC layer 3 will be described in detail. As the inorganic substance added to the UC layer 3, there are metal alkoxides (inorganic compound precursors) expressed by R1(M-OR2) as a general formula, where RI and R2 are organic groups having 1 to 8 carbon atoms, and M is a metal atom. The metal atom M is Si, Ti, Al, Zr, or the like.

The compounds in which the metal atom M is Si and that are represented by formula RI(Si—OR2) can include tetramethoxysilane, tetraethoxysilane, tetrapropoxysilane, tetrabutoxysilane, methyltrimethoxysilane, methyltriethoxysilane, dimethyldimethoxysilane, dimethyldiethoxysilane, or the like.

The compounds in which the metal atom M is Zr and that are represented by formula R1(Zr—OR2) can include tetramethoxyzirconium, tetraethoxyzirconium, tetraisoproboxyzirconium, tetrabutoxyzirconium, or the like.

The compounds in which the metal atom M is Ti and that are represented by formula RI(Ti—OR2) can include tetramethoxytitanium, tetraethoxytitanium, tetraisopropoxytitanium, tetrabutoxytitanium, and the like.

The compounds in which the metal atom M is Al and that are represented by formula RI(Al—OR2) can include tetramethoxyaluminum, tetraethoxyaluminum, tetraisopropoxyaluminum, tetraputoxyaluminum, and the like.

Other Embodiments

FIGS. 13A to D are cross-sectional configuration diagrams of variations of a gas barrier film according to another embodiment of the present invention. In other words, as cross-sectional configurations of the gas barrier film, a first variation shown in FIG. 13A, a second variation shown in FIG. 13B, a third variation shown in FIG. 13C, and a fourth variation shown in FIG. 13D can be given.

Figure 13A:
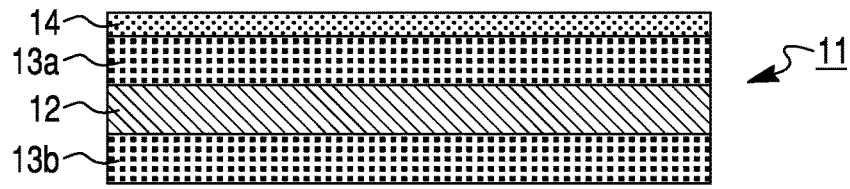
FIG. 13A is a cross-sectional configuration diagram of a variation of the gas barrier film according to the embodiment of the present invention.

The gas barrier film is, of course, realized by the above-described configuration of the laminate 1 shown in FIG. 1. However, configurations such as those shown in the variations in FIG. 13A, FIG. 13B, FIG. 13C, and FIG. 13D can also be used. In other words, as shown in FIG. 13A, in a gas barrier film 11, a UC layer 13a having a low linear expansion coefficient is formed on the top surface of a base material 12 (the second surface of the base material 12), and a UC layer 13b having a low linear expansion coefficient is also formed on the back surface of the base material 12 (the first surface of the base material 12). Furthermore, an ALD layer 14 is formed on the top surface (a surface of the UC layer 13a opposite of the surface that is in contact with the second surface of the base material 12) of the UC layer 13a formed on the top surface side of the base material 12 (the second surface of the base material 12). Here, a two-side ALD configuration is also possible by forming an ALD layer on the bottom surface of the UC layer 13b formed on the back surface side of the base material 12 (the first surface of the base material 12.

Figure 13B:
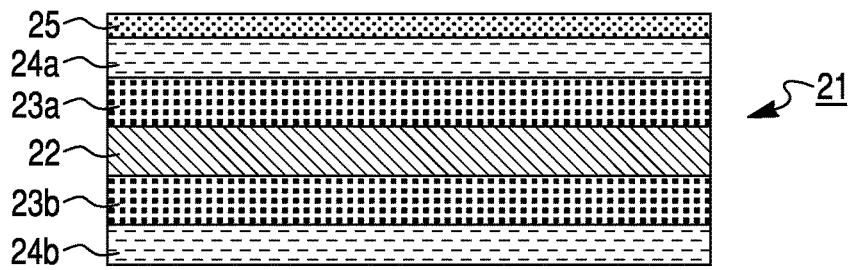
FIG. 13B is a cross-sectional configuration diagram of a variation of the gas barrier film according to the embodiment of the present invention.

In addition, as shown in FIG. 13B, in a gas barrier film 12, after a low linear expansion resin (a resin having a low linear expansion coefficient) 23a is formed on the top surface of a base material 22 (the second surface of the base material 22), the top surface thereof (the second surface of the low linear expansion resin 23a) is coated with a UC layer 24a. An ALD layer 25 is then formed on the top surface of the UC layer 24a (the second surface of the UC layer 24a). In addition, after a low linear expansion resin (a resin having a low linear expansion coefficient) 23b is formed on the back surface of the base material 22 (the first surface of the base material 22), the lower surface thereof (the first surface of the low linear expansion resin 23b) is coated with a UC layer 24a. Here, a configuration of a laminate having ALD layers on both sides is also possible by forming an ALD layer on the lower surface of the UC layer 24b (the first surface of the UC layer 24b) formed on the back surface of the base material 22 (the first surface of the base material 22).

Figure 13C:
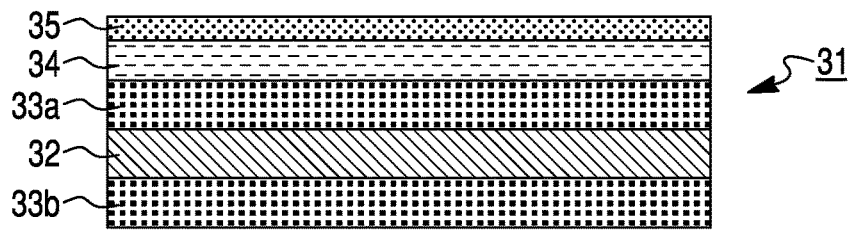
FIG. 13C is a cross-sectional configuration diagram of a variation of the gas barrier film according to the embodiment of the present invention.

In addition, as shown in FIG. 13C, in a gas barrier film 31, after a low linear expansion resin (a resin having a low linear expansion coefficient) 33a is formed on the top surface of a base material 32 (the second surface of the base material 32), the top surface of the low linear expansion resin 33a (the second surface of the low linear expansion resin 33a) is coated with a UC layer 34. An ALD layer 35 is then formed on the top surface of the UC layer 34 (the second surface of the UC layer 34). In addition, a resin having a low linear expansion coefficient (a resin having a low linear expansion coefficient) 33b is formed on the back surface of the base material 32 (the first surface of the base material 32).

Figure 13D:
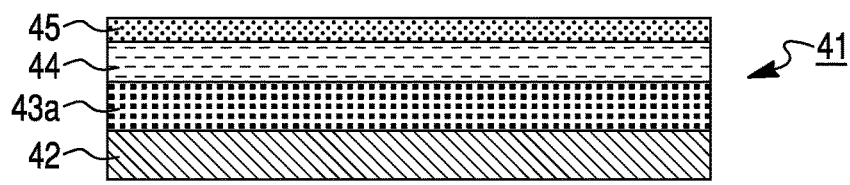
FIG. 13D is a cross-sectional configuration diagram of a variation of the gas barrier film according to the embodiment of the present invention.

In addition, as shown in FIG. 13D, in a gas barrier film 41, after a low linear expansion resin (a resin having a low linear expansion coefficient) 43a is formed on the top surface of a base material 42 (the second surface of the base material 42), the top surface of the low linear expansion resin 43a (second surface of the base material 43a) is coated with a UC layer 44. An ALD layer 45 is then formed on the top surface of the UC layer 44 (the second surface of the UC layer 44).

EXAMPLES

Next, specific examples of the laminate including the gas barrier layer composed of the atomic layer deposition film realized based on the above-described embodiment will be described.

<Film Formation Method for the Gas Barrier Layer>
<$TiO_2$ Film Formation>

A $TiO_2$ film (ALD film) was formed by the ALD method on an upper surface in which a UC layer is provided on a polymer base material. At this time, the starting material gas was titanium tetrachloride ($TiCl_4$). In addition, simultaneously with the starting material gas, $O_2$ and $N_2$ as a process gas, $O_2$ and $N_2$ as a purge gas, and $O_2$ as both a reactive gas and a plasma discharge gas were each supplied to a film formation chamber. The processing pressure at this time was 10 to 50 Pa. Furthermore, a power supply of 13.56 MHz was used as a plasma gas excitation power supply. Then, plasma discharge was performed in inductively coupled plasma (ICP) mode.

In addition, the supply time for the gases was 1 sec for $TiCl_4$ and the process gas, 30 sec for the purge gas, and 10 sec for the reactive gas and discharge gas. Simultaneously with the supply of the reactive gas and discharge gas, plasma discharge was induced in ICP mode. The output power of the plasma discharge at this time was 250 W. In addition, as gas purge after plasma discharge, the purge gas $O_2$ and $N_2$ were supplied for 10 sec. The film formation temperature at this time was 90° C.

The film formation speed and the film formation time for $TiO_2$ under cycle conditions such as those described above are as follows. The unit film formation speed was about 1.2 Å/cycle. Therefore, when 166 cycles of the film formation process were performed and film formation to a film thickness of 20 nm was performed, the total time required for film formation was about 130 min.

<Durability Test and Water Vapor Transmission Rate Measurement of the Gas Barrier Layer>

Next, the test results of the water vapor transmission rates (WVTR) before and after a durability test of the laminate including the gas barrier layer actualized based on the above-described embodiment will be described in several examples. The durability test performed herein is as follows.

The laminate was held for 30 minutes in a 150° C. oven, and then removed from the oven. After the laminate was left standing at normal temperature, the water vapor transmission rate of the laminate was measured in an atmosphere of 40° C./90% RH using a water vapor permeation measurement apparatus (MOCON Aquatran (registered trademark) or MOCON Prematran (registered trademark) manufactured by Modern Controls, Inc.).

FIG. 12 is a diagram of a comparison of WVTR between the laminates of the present examples using an undercoat having a low linear expansion coefficient and laminates of comparative examples using an undercoat having a high linear expansion coefficient. Both the examples and the comparative examples have a gas barrier layer.

The superiority of the examples will be described below with reference to FIG. 12.

Example 1

In example 1, a UC layer was formed on a polymer base material, and a $TiO_2$ thin film was then formed on the UC layer using the ALD method. Under conditions such as those indicated in example 1 in FIG. 12, with a 100 µm polyethylene terephthalate (PET) film having a liquid adhesive-treated surface on one surface and an untreated surface (referred to, hereafter, as a plain surface) on the other surface as the base material, oxygen plasma treatment (output power 300 w, treatment time 180 seconds) was performed on the plain surface. The PET base material is held at 150° C. during the durability test. Therefore, in ordinary PET, oligomers may be precipitated, causing damage to the ALD film. Therefore, in example 1, a low-oligomer PET was used.

Next, polyvinyl alcohol (PVA) serving as a material of the undercoat layer was applied, using a wire bar, to the PET surface on which the oxygen plasma treatment had been performed. The PVA-coated PET was dried at 105° C./5 min, and a PVA undercoat layer (UC layer) having a thickness of 1 µm was formed on the PET. Then, a 20 nm $TiO_2$ film was formed as the ALD film by the ALD method on the UC layer. At this time, plasma treatment was not performed on the UC layer. In addition, the linear expansion coefficient of a layered film composed of the base material and the UC layer in above-described example 1 was $6.5 \times 10^{-5}$/K or lower. Here, the linear expansion coefficient of the layered film was measured using thermomechanical analysis (TMA). Measurement was conducted using TMA/SS6100 (manufactured by Seiko Instruments, Inc.), with the layered film cut to a size of 4 mm in width×15 mm in length.

The water vapor transmission rates (WVTR) before and after the durability test were measured for a sample of a laminate in which the $TiO_2$ thin film was formed in this way as the ALD film. The measurement values of the WVTR (water vapor transmission rate) at this time were lower than $5.0 \times 10^{-4}$ [g/m²/day] before the durability test and $5.1 \times 10^{-3}$ [g/m²/day] after the durability test.

Example 2

As indicated in example 2 in FIG. 12, with a 100 µm-thick heat-resistant polyethylene terephthalate (PET) film (MICTRON; TORAY (registered trademark)) as the base material, oxygen plasma treatment (output power 300 w, treatment time 180 seconds) was performed on the plain surface. Next, a polyimide varnish was applied, using a wire bar, to the heat-resistant PET surface on which the oxygen plasma treatment had been performed, drying was performed for 30 minutes at 200° C., and a UC layer of polyimide (PI) resin having a thickness of 1 µm was provided. Then, a 20 nm $TiO_2$ film was formed as the ALD film by the ALD method on the UC layer. At this time, plasma treatment of the UC layer was not performed. In addition, the linear expansion coefficient of a layered film composed of the base material and the UC layer in above-described example 2 was $3.0 \times 10^{-5}$/K or lower. The WVTR was measured for the sample of the laminate in which the $TiO_2$ thin film was formed in this way as the ALD film. The measurement values of the WVTR at this time were lower than $5.0 \times 10^{-4}$ [g/m²/day] before the durability test and lower than $5.0 \times 10^{-4}$ [g/m²/day] after the durability test.

Example 3

As indicated in example 3 in FIG. 12, with a 100 µm-thick heat-resistant polyethylene terephthalate (PET) film (MICTRON; TORAY (registered trademark)) as the base material, oxygen plasma treatment (output power 300 w, treatment time 180 seconds) was performed on the plain surface. Next, a polyethersulfone varnish was applied, using a wire bar, to the heat-resistant PET surface on which the oxygen plasma treatment had been performed, drying was performed for 30 minutes at 200° C., and a UC layer of polyethersulfone (PES) resin having a thickness of 1 µm was provided. Then, a 20 nm $TiO_2$ film was formed as the ALD film by the ALD method on the UC layer. At this time, plasma treatment of the UC layer was not performed. In addition, the linear expansion coefficient of a layered film composed of the base material and the UC layer in above-described example 3 was $5.5 \times 10^{-5}$/K or lower. The WVTR was measured for the sample of the laminate in which the $TiO_2$ thin film was formed in this way as the ALD film. The measurement values of the WVTR at this time were lower than $5.0 \times 10^{-4}$ [g/m²/day] before the durability test and $1.5 \times 10^{-3}$ [g/m²/day] after the durability test.

Example 4

As indicated in example 4 in FIG. 12, with a 100 µm-thick heat-resistant polyethylene naphthalate (PEN) film as the base material, oxygen plasma treatment (output power 300 w, treatment time 180 seconds) was performed on the plain surface. Next, a $TiO_2$ film (ALD film) of about 20 nm was formed by the ALD method on the PEN surface on which the plasma treatment had been performed. The WVTR was measured for the sample of the laminate in which the $TiO_2$ thin film was formed in this way. The measurement values of the WVTR at this time were $7.4 \times 10^{-4}$ [g/m²/day] before the durability test and $8.1 \times 10^{-4}$ [g/m²/day] after the durability test.

Example 5

As indicated in example 5 in FIG. 12, with a 100 µm-thick heat-resistant polyethylene terephthalate (PET) film (MICTRON; TORAY) as the base material, oxygen plasma treatment (output power 300 w, treatment time 180 seconds) was performed on the plain surface side. Next, a $TiO_2$ film (ALD film) of about 20 nm was formed by the ALD method on the PET surface on which the plasma treatment had been performed. The WVTR was measured for the sample of the laminate in which the $TiO_2$ thin film was formed in this way. The measurement values of the WVTR at this time were $9.8 \times 10^{-4}$ [g/m²/day] before the durability test and $1.2 \times 10^{-3}$ [g/m²/day] after the durability test.

COMPARATIVE EXAMPLES

Next, comparative examples were implemented as comparison tests for the examples shown in FIG. 12, to show the superiority in water vapor transmission rates of the laminates including the gas barrier layer of the present examples.

Comparative Example 1

As indicated in comparative example 1 FIG. 12, a PET stretch film of 100μ was used as a polymer base material (base material). A $TiO_2$ film (ALD film) of 20 nm was formed by the ALD method on the plain surface of the base material. The WVTR was measured for the sample of the laminate in which the $TiO_2$ thin film was formed in this way. The measurement values of the WVTR at this time were $4.3 \times 10^{-3}$ [g/m$^2$/day] before the durability test and about $1.2 \times 10^{-2}$ [g/m$^2$/day] after the durability test.

Comparative Example 2

As indicated in comparative example 2 in FIG. 12, a PET stretch film of 100μ was used as a polymer base material (base material). In addition, a polyester urethane material was obtained by mixing/stirring 150 g of a urethane-based binder (solid content of 20%) and 100 g Organosilicasol (MEK-ST (registered trademark) manufactured by Nissan Chemical Industries. Ltd.). Furthermore, in a manner similar to that in example 1, an undercoat material of the polyester urethane was applied, using a wire bar, to the PET film on which plasma treatment had been performed, drying was performed for 1 minute at 100° C., and a urethane-based undercoat layer having a thickness of 1 μm was provided.

Then, a $TiO_2$ film (ALD film) of 20 nm was formed by the ALD method on the undercoat (UC) layer. At this time, plasma treatment of the UC layer was not performed. The WVTR was measured for the sample of the laminate in which the $TiO_2$ thin film was formed in this way. The measurement values of the WVTR at this time were lower than $5.0 \times 10^{-4}$ [g/m$^2$/day] before the durability test and $3.3 \times 10^{-2}$ [g/m$^2$/day] after the durability test.

That is, as indicated in example 1 to example 5, the gas barrier properties improved in all examples as a result of an organic polymer material having functional groups to which the precursor easily bonds and having a low linear expansion coefficient being provided in the undercoat layer, compared to when the undercoat layer is not provided as in comparative example 1. In addition, in comparative example 2, polyurethane that has functional groups to which the precursor easily bonds but has a high linear expansion coefficient of $10 \times 10^{-5}$/K is provided in the undercoat layer. Therefore, in comparative example 2, although high gas barrier properties were obtained before the durability test, the gas barrier properties significantly decreased after the durability test was performed. Furthermore, high gas barrier properties can be ensured from an early stage as a result of an undercoat being provided that has functional groups to which the precursor easily bonds and a low linear expansion coefficient as in example 2, and reduction in gas barrier properties could not be observed even after the durability test. In addition, the reduction range of the gas barrier properties before and after the durability test became small as in example 4.

<<Conclusion>>

As described above, in the laminate according to the first embodiment of the present invention, after the undercoat layer (UC layer) containing an organic polymer having a low linear expansion coefficient is formed on the polymer base material, the atomic layer deposition film (ALD film) is formed. As a result, a compact ALD film can be formed on the polymer base material, and a laminate having high durability can be obtained. As a result of the compact ALD film being formed in this way, the gas barrier properties of the laminate can be improved, and reduction in the gas barrier properties of the laminate can be suppressed. In addition, because the compact ALD film is grown even on the polymer base material, the laminate using the polymer base material can actualize the desired gas barrier properties even when the film thickness of the ALD film is thin.

The embodiments of the laminate of the present invention have been described in detail above, with reference to the drawings. However, the detailed configuration of the present invention is not limited by the content of the embodiments. Even should changes in design and the like be made within a range that does not depart from the spirit of the present invention, such changes are encompassed in the present invention. In addition, the present invention is also applied to a gas barrier film in which the laminate actualized by the above-described invention is formed into a film shape.

INDUSTRIAL APPLICABILITY

The laminate of the present invention can, of course, be used in electronic components, such as electroluminescent elements (EL elements), liquid crystal displays, and semiconductor wafers, and can also be effectively used in packaging films for pharmaceutical products and food products, packaging films for precision components, and the like.

REFERENCE SIGNS LIST

1 laminate
2, 12, 22, 32, 42 base material
3, 24a, 24b, 34, 44 undercoat layer (UC layer)
4, 14, 25, 35, 45 atomic layer deposition film (ALD film)
5 inorganic compound
6 precursor
11, 21, 31, 41 barrier film
13a, 13b low linear expansion UC
23a, 23b, 33a, 33b, 43a low linear expansion resin (a resin having a low linear expansion coefficient)

What is claimed is:
1. A laminate, comprising:
a base material;
an undercoat layer that is formed on at least a portion of an outer surface of the base material, the undercoat layer containing an organic polymer having functional groups, the undercoat layer being formed into a membrane shape or a film shape; and
an atomic layer deposition film that contains a precursor that serves as a starting material, the atomic layer deposition film being formed so as to cover a surface of the undercoat layer, at least some of the precursor bonding with the functional groups in the organic polymer,
wherein a linear expansion coefficient of a layered film including the base material and the undercoat layer is from about $1.0 \times 10^{-5}$/K or higher and about $8.0 \times 10^{-5}$/K or lower,
wherein the precursor that is bonded with the functional groups of the organic polymer is a first precursor,
wherein the first precursor is bonded to a second precursor adjacent to the first precursor such that the first precursor and the second precursor are cross-linked with each other,
wherein the atomic layer deposition film comprises a two-dimensional film grown in a planar direction of the undercoat layer, the atoms of the two-dimensional film being bonded in the planar direction, wherein a main component of the undercoat layer is the organic polymer, and wherein the undercoat layer comprises an inorganic substance, an organic polymer, and a binder, and is formed so that at least some of the first precursor bonds with the binder and the inorganic substance.

2. The laminate according to claim 1, wherein:

the functional groups in the organic polymer include a functional group having an oxygen atom or a functional group having a nitrogen atom.

3. The laminate according to claim 2, wherein the functional group containing an oxygen atom is one or more type selected from a group comprising an OH group, a COOH group, a COOR group, an NCO group, and a $SO_3$ group; and the functional group containing a nitrogen atom is an $NH_X$ group in which X is an integer.

4. The laminate according to claim 1, wherein the functional group of the organic polymer includes an atom having an unshared electron pair or an unpaired electron.

5. The laminate according to claim 1, wherein:

the binder is a compound of one or more type selected from a group comprising organic binders, inorganic binders, and hybrid binders of an organic and inorganic mixture.

6. The laminate according to claim 1, wherein:

the undercoat layer includes a first surface that is in contact with the base material and a second surface that is provided opposite of the first surface; and at least a portion of the first surface and the second surface is surface treated by plasma treatment, corona treatment, or hydrolysis treatment.

7. A gas barrier film wherein the laminate according to claim 1 is formed into a film shape.

8. The laminate of claim 1, wherein the two-dimensional film comprises $TiO_2$.

9. A method for manufacturing a laminate wherein:

a base material is placed;

an undercoat layer is formed on at least a portion of an outer surface of the base material, a linear expansion coefficient of a layered film including the base material and the undercoat layer is from about $1.0 \times 10^{-5}$/K or higher and about $8.0 \times 10^{-5}$/K or lower, the undercoat layer containing an organic polymer having functional groups, the undercoat layer having a membrane shape or a film shape;

surface treatment is performed on at least a portion of a first surface in a thickness direction of the undercoat layer that is in contact with the base material and a second surface provided opposite of the first surface; and an atomic layer deposition film is formed on the second surface of the undercoat layer to cover the second surface, so that a precursor that is a starting material of the atomic layer deposition film bonds with functional groups of the organic polymer contained in the undercoat layer, wherein the precursor that is bonded with the functional groups of the organic polymer is a first precursor, wherein the first precursor is bonded to a second precursor adjacent to the first precursor such that the first precursor and the second precursor are cross-linked with each other, wherein the atomic layer deposition film comprises a two-dimensional film grown in a planar direction of the undercoat layer, the atoms of the two-dimensional film being bonded in the planar direction, wherein a main component of the undercoat layer is the organic polymer, and wherein the undercoat layer comprises an inorganic substance, an organic polymer, and a binder, and is formed so that at least some of the first precursor bonds with the binder and the inorganic substance.

10. The method for manufacturing a laminate according to claim 9, wherein the surface treatment is plasma treatment, corona treatment, or hydrolysis treatment.

11. A method for manufacturing a gas barrier film wherein a laminate manufactured by the method for manufacturing a laminate according to claim 9 is formed into a film shape.

* * * * *